United States Patent
Itose et al.

(10) Patent No.: US 12,123,906 B2
(45) Date of Patent: Oct. 22, 2024

(54) ELECTRONIC DEVICE INSPECTION APPARATUS

(71) Applicant: Mitsubishi Electric Corporation, Tokyo (JP)

(72) Inventors: Kazuya Itose, Tokyo (JP); Tetsuhiro Fukao, Tokyo (JP); Motoyoshi Koyanagi, Tokyo (JP); Yohei Mikami, Tokyo (JP); Masafumi Takeda, Tokyo (JP); Yasuhiro Yamauchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 110 days.

(21) Appl. No.: 17/907,639

(22) PCT Filed: May 13, 2020

(86) PCT No.: PCT/JP2020/019103
§ 371 (c)(1),
(2) Date: Sep. 28, 2022

(87) PCT Pub. No.: WO2021/229714
PCT Pub. Date: Nov. 18, 2021

(65) Prior Publication Data
US 2023/0131641 A1    Apr. 27, 2023

(51) Int. Cl.
*G01R 31/26* (2020.01)

(52) U.S. Cl.
CPC ............... *G01R 31/2601* (2013.01)

(58) Field of Classification Search
CPC ...... G01R 31/26; G01R 1/06755; G01R 1/06; G01R 1/073; G01R 31/28; G01R 31/2601; G01R 31/2886

(Continued)

(56) References Cited

U.S. PATENT DOCUMENTS

| 6,724,203 B1 * | 4/2004 | Goldmann | ......... G01R 1/07314 |
| | | | 324/755.05 |
| 2008/0032519 A1 | 2/2008 | Murata | |
| 2008/0057600 A1 * | 3/2008 | Murata | .............. H01R 13/2421 |
| | | | 361/772 |

FOREIGN PATENT DOCUMENTS

| CN | 101118995 A | 2/2008 |
| JP | 2002-313855 A | 10/2002 |

OTHER PUBLICATIONS

International Search Report issued in PCT/JP2020/019103; mailed Aug. 11, 2020.

(Continued)

*Primary Examiner* — Eman A Alkafawi
*Assistant Examiner* — Courtney G McDonnough
(74) *Attorney, Agent, or Firm* — Studebaker & Brackett PC

(57) ABSTRACT

An electronic device inspection apparatus of the present application comprises an inspection table for positioning and holding an electrode disposed on a semiconductor device, a contact element that is formed of a shape memory alloy in a long and thin plate shape and has a base part fixed to the inspection table and a variable part formed in a shape of a spiral at a first temperature and being developed from the spiral at a second temperature; and a measurement circuitry for measuring the semiconductor device by conducting a current to flow into the electrode via the contact element. The axis of the spiral of the variable part is parallel to the electrode face of the positioned electrode and a contact region is formed along a longitudinal direction between the variable part and the positioned electrode at the second temperature.

20 Claims, 8 Drawing Sheets

(58) Field of Classification Search
USPC .................................................. 324/750.03
See application file for complete search history.

(56) References Cited

OTHER PUBLICATIONS

An Office Action issued by the State Intellectual Property Office of the People's Republic of China on Aug. 23, 2024, which corresponds to Chinese Patent Application No. CN 202080100563.1.

* cited by examiner

ELECTRONIC DEVICE INSPECTION APPARATUS

TECHNICAL FIELD

The present application relates to an electronic device inspection apparatus.

BACKGROUND ART

In an electronic device such as a semiconductor device, it is necessary to bring a contact element for an inspection into contact with an electrode in order to conduct an electric current for an inspection of electrical characteristics. At the inspection, a height of the electrode of the electronic device as an inspection target does not fall within a predetermined range, a contact failure occurs between the contact element and the electrode, and accurate inspection cannot be performed. Therefore, there is a disclosed inspection apparatus disclosed in which a contact provided at the tip of an arm extending toward the electrode is actively moved by the deformation of the arm (for example, refer to Patent Document 1).

CITATION LIST

Patent Document

Patent Document 1: Japanese Unexamined Patent Application Publication No. 2002-313855 (paragraphs 0027 to 0031, FIG. 1 to FIG. 5)

SUMMARY OF INVENTION

Problems to be Solved by Invention

However, in the configuration in which only the contact is moved close to the electrode, for example, when the inspection target is set in an inclined state, peripheral portions of the electrode interfere and the contact cannot be brought into contact with the electrode, so that the inspection target needs to be reset, thereby lowering the inspection efficiency.

It is an object of the present application to provide an electronic device inspection apparatus capable of efficiently and accurately inspecting an electronic device.

Means for Solving Problems

An electronic device inspection apparatus disclosed in the present application comprises a holding mechanism to position and hold an electrode disposed in an electronic device, at least one contact element formed of a shape memory alloy in a long and thin plate shape, one end side of the contact element being fixed to the holding mechanism, the other end side thereof being formed in a shape of a spiral at a first temperature and being developed from the spiral at a second temperature, and a measurement unit to measure the electronic device by conducting a current into the electrode via the contact element, wherein an axis of the spiral in the other end side is parallel to a face of the positioned electrode, and a contact region is formed along a longitudinal direction between the other end side and the positioned electrode at the second temperature.

Effect of Invention

According to the electronic device inspection apparatus disclosed in the present application, since the contact is formed along the electrode face, the electronic device can be inspected efficiently and accurately.

MODES FOR CARRYING OUT INVENTION

Embodiment 1

Figure 1A:
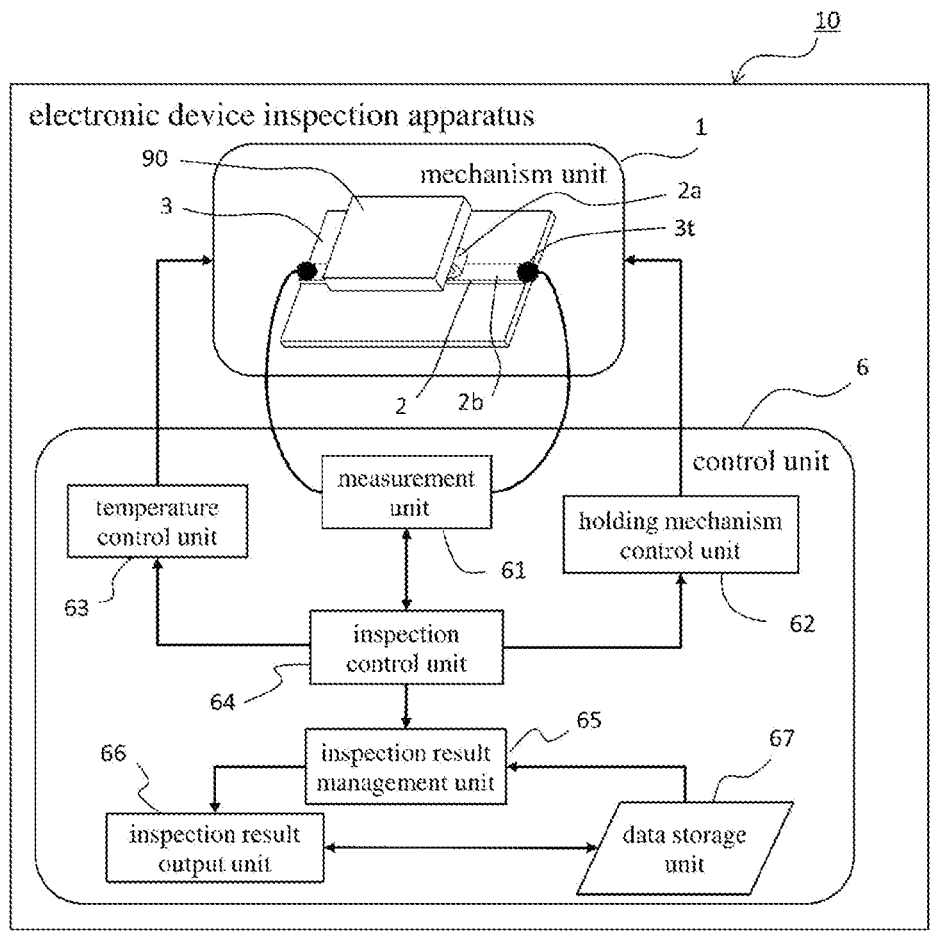
FIG. 1A and FIG. 1B are a block diagram showing a configuration of an electronic device inspection apparatus according to Embodiment 1 and a schematic diagram showing a shape change of a contact element with a temperature change, respectively.
Figure 1B:
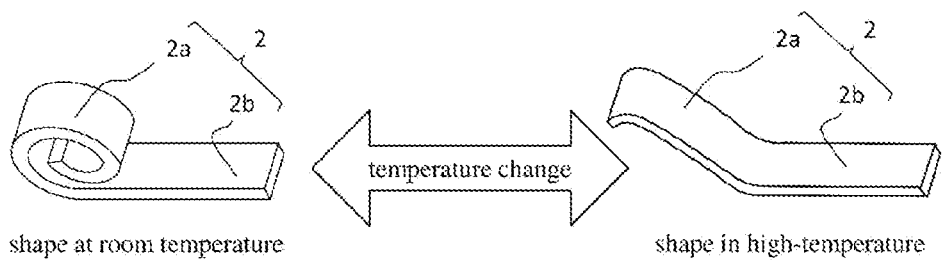
Figure 2:
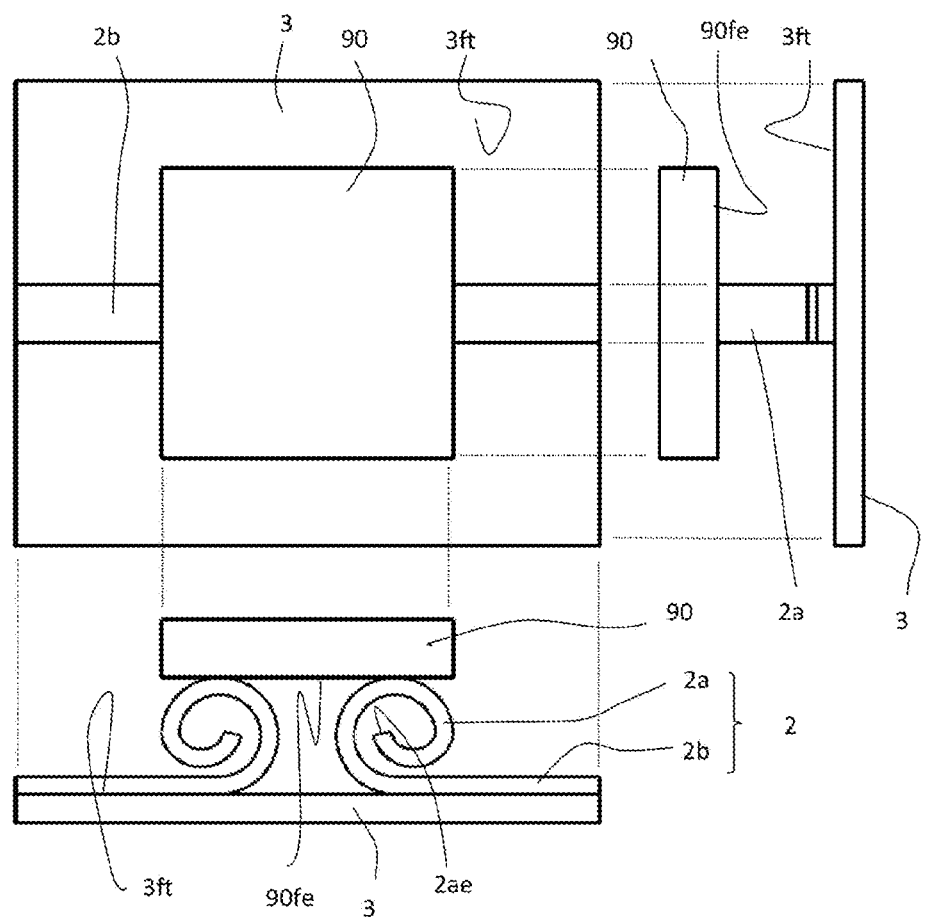
FIG. 2 is a schematic diagram in a three-view drawing showing an inspection table part for explaining the configuration of an electronic device inspection apparatus according to Embodiment 1.
Figure 3A:
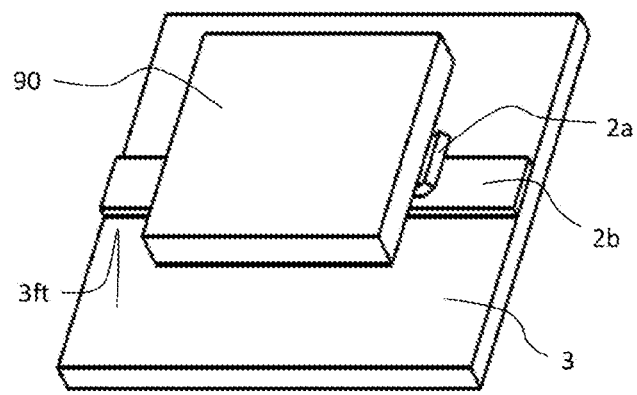
FIG. 3A and FIG. 3B are a perspective view of the inspection table part and a schematic view thereof in a three-view drawing for explaining the configuration of the electronic device inspection apparatus according to Embodiment 1, respectively.
Figure 3B:
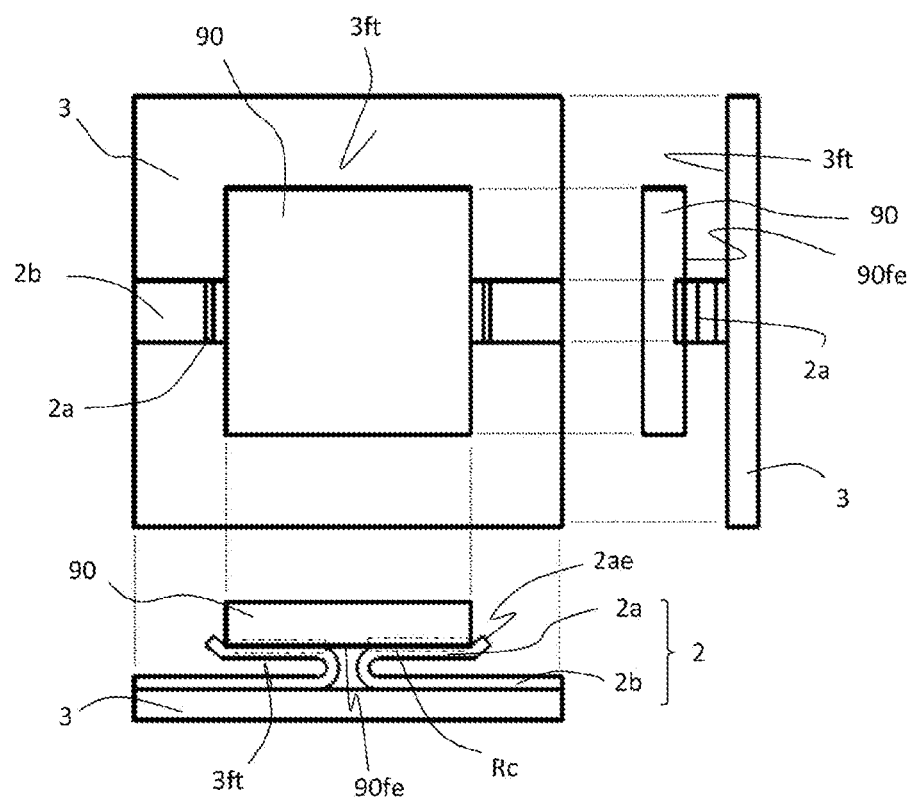

FIG. 1A to FIG. 3B are diagrams for explaining an electronic device inspection apparatus according to Embodiment 1, and FIG. 1A is a block diagram including a schematic drawing of an inspection table part on which an electronic device as an inspection target is placed, as a configuration of the electronic device inspection apparatus, and FIG. 1B is a schematic diagram showing a shape change due to a temperature change of a contact element to be brought into contact with an electrode of the electronic device. FIG. 2 is a schematic diagram showing the inspection table part in a three-view drawing by the third angle projection method. Further, FIG. 3A is a perspective view of the inspection table part with the contact element deformed so as to be in contact with an electrode, and FIG. 3B is a schematic diagram showing the inspection table part in a three-view drawing.

Figure 4A:
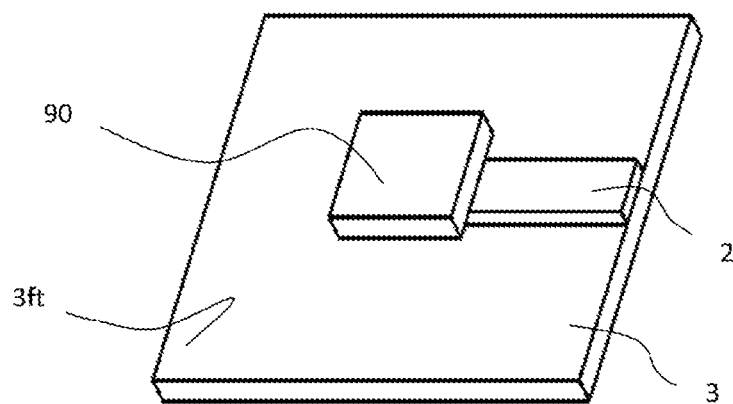
FIG. 4A and FIG. 4B are perspective views each for explaining a shape of the inspection table having a different arrangement in the contact element in the electronic device inspection apparatus according to Embodiment 1.
Figure 4B:
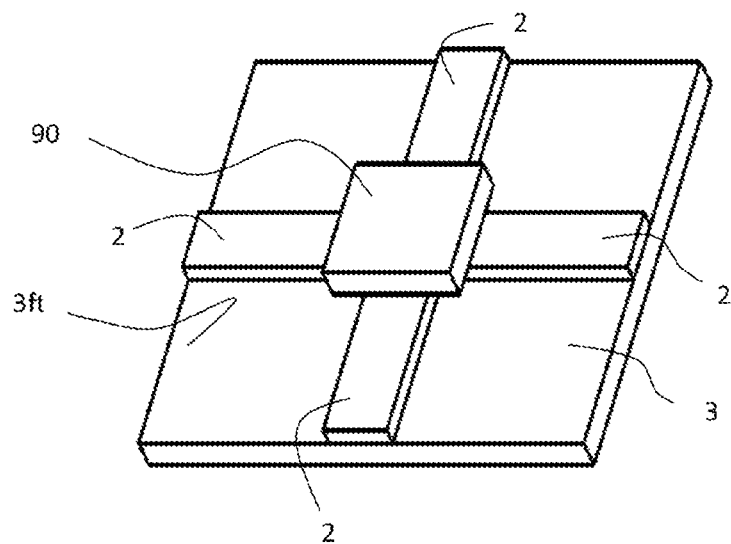
Figure 5A:
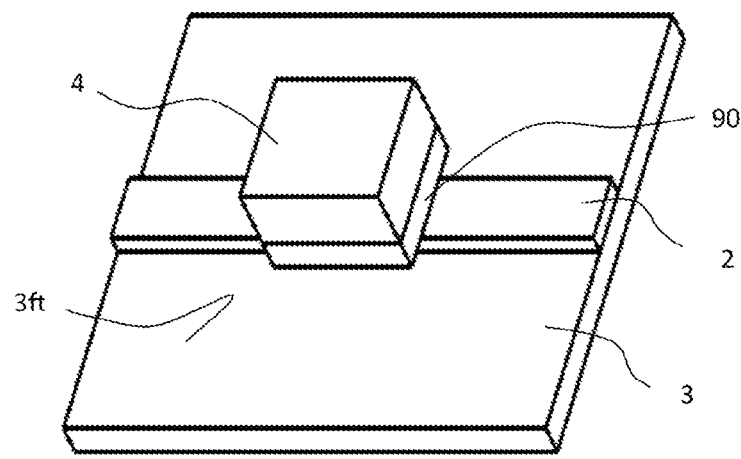
FIG. 5A and FIG. 5B each are a perspective view of an inspection table part for explaining a configuration of an electronic device inspection apparatus according to a first variation and a second variation of Embodiment 1.
Figure 5B:
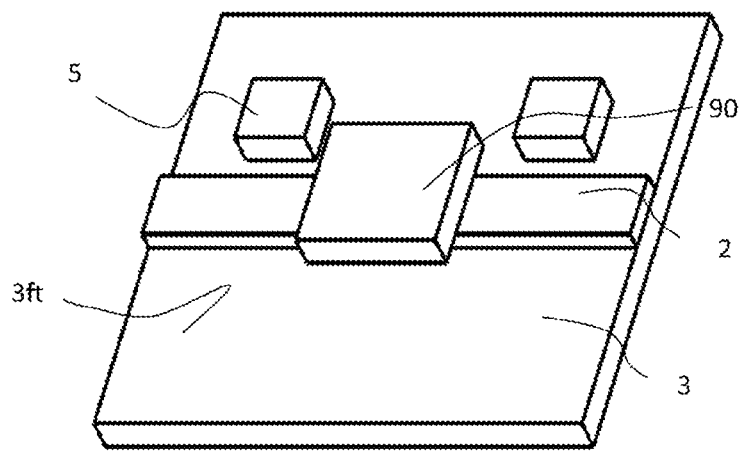

FIG. 4A, FIG. 4B and FIG. 5A, FIG. 5B are diagrams for explaining the electronic device inspection apparatus according to an application example of Embodiment 1, and FIG. 4A and FIG. 4B shows an example in which the number of contact elements is changed, and FIG. 4A is a perspective view of an inspection table in which one contact element is arranged and FIG. 4B is a perspective view of an inspection table in which four contact elements are arranged. FIG. 5A is a perspective view of an inspection table part of an electronic device inspection apparatus according to a first modification example and FIG. 5B is a perspective view of an inspection table part of an electronic device inspection apparatus according to a second modification example.

As shown in FIG. 1A, an electronic device inspection apparatus 10 according to Embodiment 1 includes a mechanism unit 1 having a contact element 2 for forming a contact with an electrode for measuring electrical characteristics of a semiconductor device 90 as the inspection target, and a control unit 6 for controlling a measurement operation. In an electronic device such as the semiconductor device 90, an electrode (not shown) is formed on one face (electrode arrangement face 90fe in FIG. 2), and electric characteristics are measured by conducting an electric current into the electrode.

The mechanism unit 1 includes the contact elements 2 and the inspection table 3 to which one end side (base portion 2b) of the contact element 2 is fixed and to which, for example, a jig (not shown) for holding the semiconductor device 90 is attached. In the inspection table 3, a portion to which the contact elements 2 is fixed is made of an insulating material such as an insulating substrate, and terminals 3t corresponding to the respective contact elements 2 are provided for the connection with wiring from the measurement unit 61. Further, as will be described in variation examples to be described later, a device or the like for temperature control or for fixing the semiconductor device 90 may be provided.

The contact element 2 is made of a shape memory alloy such as a nickel-titanium alloy or the like, and is formed into a long and thin plate shape. As shown in FIG. 1B, the contact element 2 is configured with the base portion 2b at one end side that is fixed to a top face 3ft of the inspection table 3, and a variable portion 2a at the other end side that is reversibly changed in shape from a spiral shape to a flat shape or a reverse curved shape due to temperature change and forms the contact with the electrode described above.

As shown in FIG. 2, the base portion 2b is fixed to the top face 3ft such that the variable portion 2a in the spiral shape with the axis of the spiral parallel to the electrode arrangement face 90fe rises from the top face 3ft toward the electrode arrangement face 90fe. In other words, the base portion 2b is fixed to the top face 3ft away from the electrode arrangement face 90fe with the variable portion 2a that spirals in the direction so as to approach the electrode arrangement face 90fe. At this time, the base portion 2b is fixed to the inspection table 3 in such a way that the side of the variable portion 2a in the spiral shape close to the electrode arrangement face 90fe is directed in the direction forward to a free end 2ae from the inner side to the outer side with respect to the electrode arrangement face 90fe of the semiconductor device 90 that is positioned. As a result, when the spiral of the variable portion 2a develops due to the temperature change, the free end 2ae is to be directed to the outer side of the electrode arrangement face 90fe.

Note that the length of the portion in the spiral shape needs to be a length such that the connection can be made even if there is a gap between the contact element 2 and the electrode face when the shape is recovered. For example, in consideration of manufacturing errors in the height direction of the electrode face and the contact element 2, it is necessary to have a length for securing a deformation amount and a contact area necessary for generating a pressing force due to elastic deformation, which is to be described later.

The control unit 6 includes a measurement unit 61 for measuring electrical characteristics by conducting a current into the inspection target, an inspection control unit 64 for controlling the entire inspection operation, an inspection result management unit 65 for managing inspection results, an inspection result output unit 66 for outputting the inspection results, and a data storage unit 67 for storing data. Further, for example, a temperature control unit 63 for changing the shape of the contact element 2 and a holding mechanism control unit 62 for controlling a mechanism for holding the inspection target may be provided.

Details will be described on the basis of the above-described configuration. When the semiconductor device 90 as the inspection target is installed on the inspection table 3, the contact element 2 at a room temperature is in the spiral shape, and as described above, the side close to the electrode arrangement face 90fe is directed in the direction forward to the free end 2ae from the inner side to the outer side. At this time, since there is a gap between the variable portion 2a and the electrode arrangement face 90fe, the semiconductor device 90 can be easily positioned with respect to the inspection table 3 by using a jig (not shown) without interference by the contact element 2.

In this state, when the temperature of the contact element 2 is increased, the variable portion 2a is developed from the spiral, and as shown in FIG. 3A and FIG. 3B, the variable portion 2a is deformed along the electrode face from a portion in contact with the electrode (not shown) of the electrode arrangement face 90fe to form a U shape, and a contact region Rc is formed between the variable portion 2a and the electrode face. In the high-temperature state, originally, the flat portion is elastically deformed to act as a spring, so that the variable portion 2a generates a pressing force against the electrode face to make it possible to have an excellent electrical connection with the contact region Rc by the faces.

That is, by utilizing the deformation caused by the shape memory, it is possible to accurately position the semiconductor device 90 without the interference by the contact element 2 and inspect the semiconductor device 90. Further, even if the semiconductor device 90 is placed to be inclined or the electrode face is inclined, the variable portion 2a can be deformed along the inclined electrode face and can apply a pressing force thereto, so that the electronic device can be inspected efficiently and accurately.

Note that, when the contact element is formed using a bimetal, which deforms due to a difference in their linear expansion coefficients, it is possible to change the shape between a spiral shape and a flat shape depending on the temperature. However, in this case, although the contact element has an action of a spring due to the change in the curvature, it is difficult to deform in a direction crossing the bending direction, and there is a possibility that it may be unevenly hit against the inclined electrode face, and thus formation of the contact region Rc by the faces is difficult. On the other hand, the contact element 2 formed using the shape memory alloy can be deformed not only in the bending direction but also in the direction crossing the bending direction, and an excellent contact can be made by the deformation along the electrode face. Therefore, the contact resistance is small and accurate measurement can be performed, and since the pressing force is dispersed, damage to the electrode face of the semiconductor device 90 can be suppressed.

In the above example, an example in which the spiral shape is kept at a normal temperature and the flat shape is recovered at a high temperature is shown, but this is not a limitation. For example, if the shape memory alloy which recovers its shape at a normal temperature is used for the contact element 2, when the semiconductor device 90 is installed at a high temperature, since there is no action of the spring as described above, accurate positioning can be achieved without interference such as pushback by the contact element 2. Then, by cooling the contact element 2 to a temperature at which it recovers its shape, an excellent contact region Rc is formed, and accurate inspection can be performed.

In addition, the number of the contact elements 2 to be installed on the inspection table 3 is not limited to two, and as shown in FIG. 4A and FIG. 4B, any number such as one or four may be used depending on the inspection target or the inspection contents. On the other hand, in consideration of the interference by the contact element 2 described above, the effect of facilitating the positioning according to the present application is exhibited as the number of the contact elements 2 increases.

First Variation Example

In order to prevent the semiconductor device 90 from being dragged and moved when the contact element 2 recovers its shape, a movement prevention tool 4 such as a stopper, a pressing tool, or a weight may be provided as shown in FIG. 5A. At this time, the inspection control unit 64 may monitor the progress of the measurement by the measurement unit 61, and the holding mechanism control unit 62 may control the driving and releasing of the movement prevention tool 4. With such a configuration, since the contact pressure between the recovered contact element 2 and the semiconductor device 90 is increased, the electrical connection becomes more reliable, and the replacement with a next inspection target is quickly performed, so that the inspection efficiency is increased.

Second Variation Example

Also, the mechanism for changing the temperature of the contact element 2 may be implemented by bringing a heat source, such as a dryer, close to the contact element 2, or by putting the contact element including the inspection target in a constant temperature oven or the like for raising the ambient temperature. Further, for example, a thermal module 5 such as a Peltier device may be disposed in the vicinity of the contact element 2 as shown in FIG. 5B. At this time, the inspection control unit 64 may monitor the progress of the measurement carried out by the measurement unit 61, and may cause the temperature control unit 63 to control the heating and cooling by the thermal module 5, the On/Off of the dryer, or the loading to and unloading from the constant temperature oven. In particular, when inspections are performed at a high temperature, it is suitable to accurately control the temperature at the time of inspection if the heating and cooling are made into a managed process.

Embodiment 2

Figure 6A:
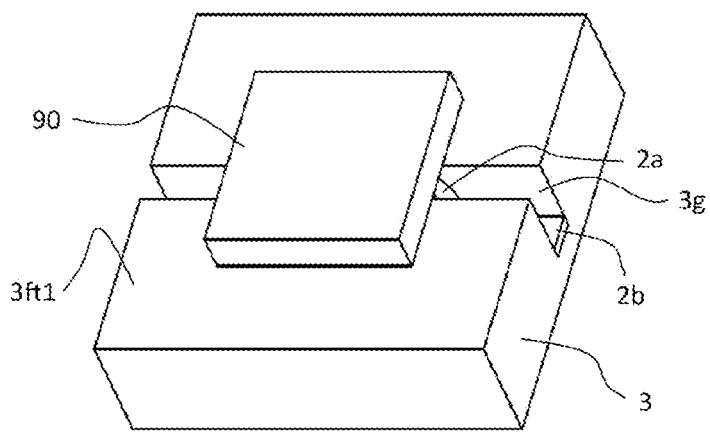
FIG. 6A and FIG. 6B are a perspective view of an inspection table part and a schematic view thereof in a three-view drawing for explaining a configuration of an electronic device inspection apparatus according to Embodiment 2, respectively.
Figure 6B:
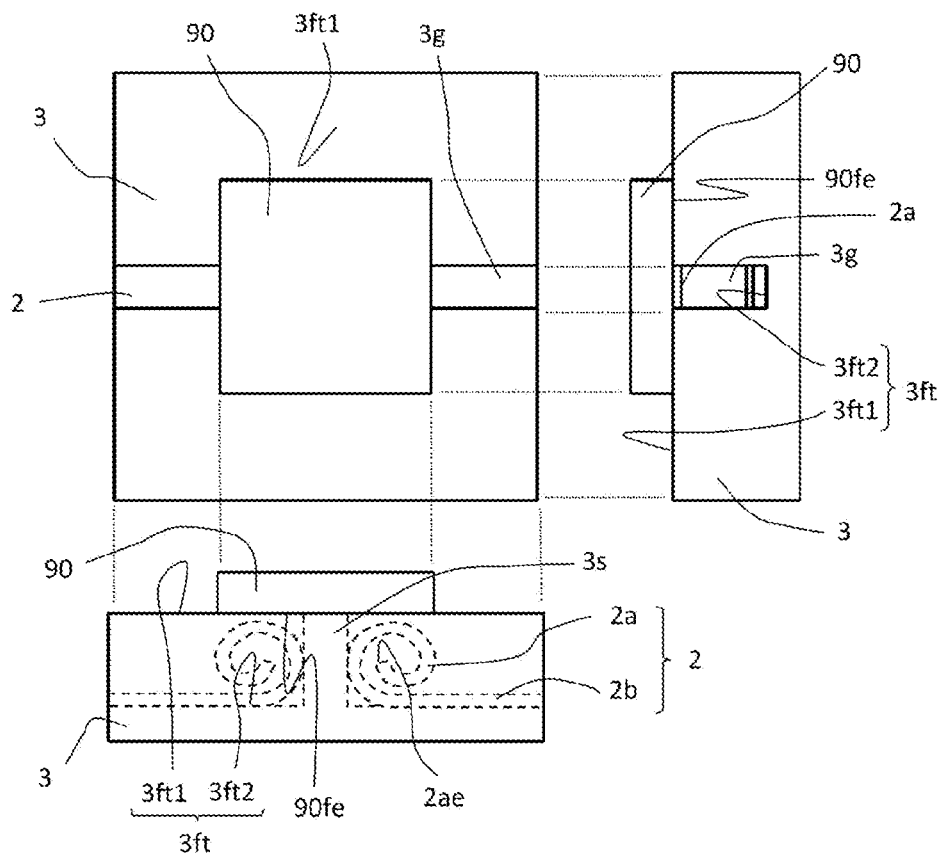

In Embodiment 1, the relationship of the height between the contact element and the inspection table is not described. In Embodiment 2, an example in which a contact element can be housed in a trench of an inspection table will be described. FIG. 6A and FIG. 6B are diagrams for explaining an electronic device inspection apparatus according to Embodiment 2, and FIG. 6A is a perspective view of an inspection table part and FIG. 6B is a schematic view thereof in a three-view drawing. Note that the movement of the contact element is the same as that described in Embodiment 1, and FIG. 1A and FIG. 1B are referred to for the configuration of the entire electronic device inspection apparatus and the contact element itself, and FIG. 3B is referred to for the form when the contact element recovers to form the contact region.

In the electronic device inspection apparatus 10 according to Embodiment 2, as shown in FIG. 6A and FIG. 6B, a trench 3g is formed in the inspection table 3 downward from the mounting face 3ft1 on which the semiconductor device 90 is mounted, and the trench 3g is formed corresponding to each contact element 2. Then, the base portion 2b of the contact element 2 is fixed on a bottom face 3ft2 of the trench 3g, and the contact element 2 is housed in the trench 3g such that the variable portion 2a is placed between the mounting face 3ft1 and the bottom face 3ft2 when the variable portion 2a is in the spiral shape.

In the inspection table 3, the wall face of the trench 3g is also formed of an insulating material, and the contact elements 2 connected to the terminals 3t (not shown) each are disposed there. When the semiconductor device 90 is installed on the mounting face 3ft1 of the inspection table 3, the electrode arrangement face is not in contact with and is not electrically connected to the variable portion 2a in the state where the variable portion 2a is in the spiral shape. However, by raising the temperature to the temperature at which the shape is recovered, the contact element 2 is deformed along the electrode face of the semiconductor device 90 as in Embodiment 1, and is electrically connected by forming the contact region Rc.

Since the semiconductor device 90 is installed on the mounting face 3ft1 of the inspection table 3 itself, the parallelism between the electrode arrangement face 90fe and the bottom face 3ft2 is higher than that in the case through a jig or the like, and the accuracy of electrical connection when the shape of the contact 2 is recovered is improved. Further, by raising the temperature of the contact element 2 at an arbitrary timing, the contact element 2 can be electrically connected to the electrode of the semiconductor device 90. Therefore, when the semiconductor device 90 is installed, occurrence of electrostatic discharge due to charging of the human body can be suppressed, and thus the semiconductor device 90 can be protected.

Since the contact element 2 is housed in the trench 3g, the side face of the trench 3g serves as a guide, and the contact element 2 is deformed along the side face when the shape of the contact element 2 is recovered. Therefore, if the width of the trench 3g is made equal to the width of the electrode of the semiconductor device 90, positional deviation from the electrode when the contact element 2 is deformed can be prevented, and the electrical connection can be made more reliably. Further, since the semiconductor device 90 is in contact with the mounting face 3ft1, there is no physical load pressing the contact element 2 at the time of the installation, and even when the semiconductor device 90 generates heat, the heat radiation performance of the inspection table 3 is also enhanced, so that the thermal load on the contact element 2 and the semiconductor device 90 is reduced. This is particularly effective when an electronic device having a large amount of heat generation is used as the inspection target.

In the case where a plurality of contact elements 2 are adjacent to each other in a longitudinal direction, there may be a case where the contact elements 2 come into contact with each other at the time of shape change to cause an unintended portion to be conductive, thereby making it impossible to perform the inspection accurately. However, when the partition 3s is provided to partition the trench 3g, the contact elements 2 will not come into contact with each other and will not be electrically connected in the process of changing the shape thereof.

Note that, even in the case where the trench 3g is provided, it is needless to say that the movement prevention tool 4 and the thermal module 5 may be provided as described in the first and second variation examples of Embodiment 1.

Embodiment 3

Figure 7A:
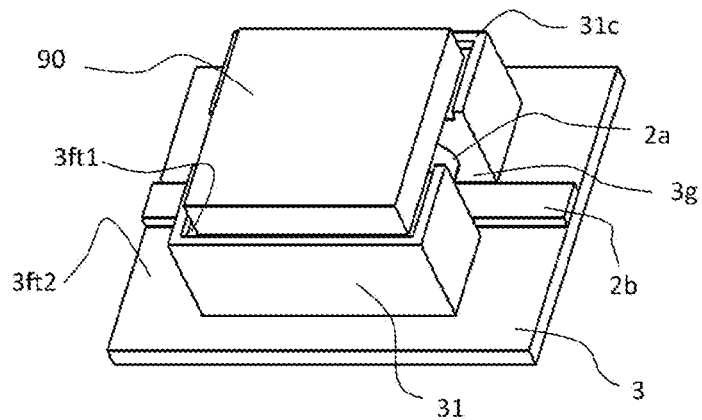
FIG. 7A and FIG. 7B are a perspective view of an inspection table part and a schematic view thereof in a three-view drawing for explaining a configuration of an electronic device inspection apparatus according to Embodiment 3, respectively.
Figure 7B:
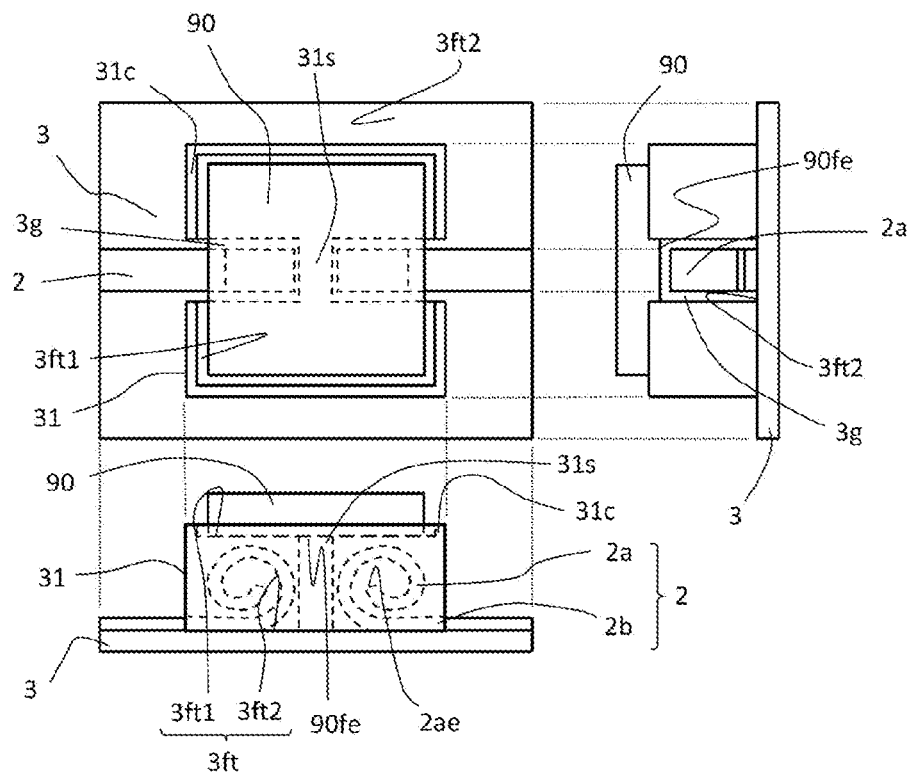

In Embodiment 2, a configuration for the positioning of the semiconductor device in the direction parallel to the mounting face has not been described. In Embodiment 3, an example in which a socket capable of positioning and fixing the semiconductor device is provided will be described. FIG. 7A and FIG. 7B are diagrams for explaining an electronic device inspection apparatus according to Embodiment 3 and FIG. 7A is a perspective view of an inspection table part and FIG. 7B is a schematic view thereof in a three-view drawing. Note that, in Embodiment 3, the movement of the contact element is the same as that described in Embodiment 1, and FIG. 1A and FIG. 1B are referred to for the configuration of the entire electronic device inspection apparatus and for the form of the contact element itself, and FIG. 3B is referred to for the form when the contact element is recovered to form the contact region.

In the electronic device inspection apparatus 10 according to Embodiment 3, as shown in FIG. 7A and FIG. 7B, the inspection table 3 is provided with a socket 31 into which the semiconductor device 90 is fitted. The socket 31 is formed with the trench 3g for housing the contact element 2, which is described in Embodiment 2, the mounting face 3ft1 for mounting the semiconductor device 90, and a frame portion 31c for supporting the four sides of the semiconductor device 90 that is in a rectangular plate shape.

The wall face of the trench 3g formed in the socket 31 is also formed of an insulating material, and the contact elements 2 connected to the terminals 3t (not shown) each are disposed there. When the semiconductor device 90 is installed on the mounting face 3ft1 in the frame portion 31c of the socket 31, the electrode arrangement face is not in contact with and is not electrically connected to the contact element 2 in the state where the variable portion 2a is in the spiral shape. However, by raising the temperature to the temperature at which the shape is recovered, the contact element 2 is deformed along the electrode face of the semiconductor device 90 as in Embodiment 1, and is electrically connected by forming the contact region Rc.

At the time, since the four sides of the semiconductor device 90 in a rectangular plate shape adjacent to the electrode arrangement face 90fe are supported by the frame portion 31c, positioning in the direction parallel to the electrode arrangement face 90fe can be facilitated, and positional deviation can be prevented even when the force is applied at the shape recovery as described above. Further, as described in Embodiment 2, since the parallelism between the electrode arrangement face 90fe and a bottom face 3ft2 is high, the accuracy in the electrical connection when the shape of the contact element 2 is recovered is improved. Further, by raising the temperature of the contact element 2 at an arbitrary timing, the contact element 2 can be electrically connected to the electrode of the semiconductor device 90. Therefore, when the semiconductor device 90 is installed, occurrence of electrostatic discharge due to charging of the human body can be suppressed, and thus the semiconductor device 90 can be protected.

Since the contact element 2 is housed in the trench 3g, the side face of the trench 3g serves as a guide, and the contact element 2 is deformed along the side face when the shape of the contact element 2 is recovered. Therefore, if the width of the trench 3g is made equal to the width of the electrode of the semiconductor device 90, positional deviation from the electrode when the contact element 2 is deformed can be prevented, and the electrical connection can be made more reliably. Further, since the semiconductor device 90 is in contact with the mounting face 3ft1, there is no physical load pressing the contact element 2 at the time of the installation, and even when the semiconductor device 90 generates heat, the frame portion 31c also functions as a heat radiation path, so that the heat radiation performance is further enhanced than that of Embodiment 2, and the thermal load on the contact element 2 and the semiconductor device 90 is reduced. This is particularly effective when an electronic device having a large amount of heat generation is used as the inspection target. The socket 31 is detachably fixed to the inspection table 3 by a screw or the like, so that other components can be reused by replacing the socket 31 even when the semiconductor device 90 is burned out.

Further, even when the socket 31 is used, if a plurality of contact elements 2 are arranged in the same direction, the contact elements 2 may come into contact with each other at the time of shape change to cause an unintended portion to be conductive, thereby making it impossible to perform the inspection accurately. However, when the partition 3s is provided to partition the trench 3g, the contact elements 2 will not come into contact with each other and will not be electrically connected in the process of changing the shape thereof. Note that, even in the case where the socket 31 is provided, it is needless to say that the movement prevention tool 4 and the thermal module 5 may be provided as described in the first and second variation examples of Embodiment 1.

Figure 8:
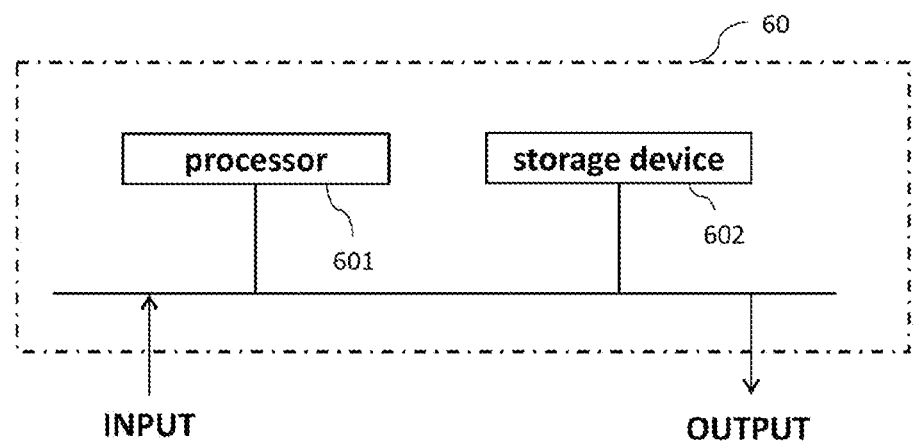
FIG. 8 is a block diagram showing a hardware configuration of a control unit of an electronic device inspection apparatus according to each embodiment.

In the electronic device inspection apparatus 10 according to each embodiment, for example, a part for executing calculation or control of the control unit 6 may be represented as hardware 60 constituted with a processor 601 and a storage device 602 as shown in FIG. 8. The storage device 602 includes a volatile storage device such as a random access memory (not shown) and a non-volatile auxiliary storage device such as a flash memory. Further, an auxiliary storage device of a hard disk may be provided instead of the flash memory. The processor 601 executes a program input from the storage device 602. In this case, the program is input from the auxiliary storage device to the processor 601 via the volatile storage device. Further, the processor 601 may output data such as a calculation result to the volatile storage device of the storage device 602 or may store data in the auxiliary storage device via the volatile storage device.

Note that, although various exemplary embodiments and examples are described in the present application, a combination of various features, aspects, and functions described in the embodiments are not limited to the contents disclosed in the embodiments and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with another component are included.

For example, although the variable portion 2a extends to the outer side of the electrode arrangement face 90fe of the semiconductor device 90, it is not limited to this example, and may be arranged so as to extend to the inner side thereof. Further, although a case where the variable portion 2a formed in the spiral shape and spaced apart from the electrode has been described as a preferred example, the space is not necessarily required, and the variable portion 2a may be in contact with the electrode as long as it does not generate an excessive repulsive force.

As described above, the electronic device inspection apparatus 10 according to the embodiments includes the holding mechanism (inspection table 3) for positioning and holding the electrode disposed in the electronic device (semiconductor device 90), the contact element 2 formed of a shape memory alloy in a long and thin plate shape, one end side (base portion 2b) of the contact element being fixed to the holding mechanism (top face 3ft, or bottom face 3ft2), the other end side (variable portion 2a) thereof being formed in a shape of a spiral at the first temperature (for example, room temperature) and being developed from the spiral at the second temperature (for example, higher temperature than room temperature), and the measurement unit 61 for measuring the electronic device (semiconductor device 90) by conducting a current into the electrode through the contact element 2. Since the axis of the spiral in the other end side (variable part 2a) is parallel to the face of the positioned electrode (electrode arrangement plane 90fe or electrode face) and the contact region Rc is formed along the longitudinal direction between the other end side (variable portion 2a) and the positioned electrode at the second temperature, the contact with the contact element 2 is formed along the electrode face, so that the electronic device (semiconductor device 90) can be efficiently and accurately inspected.

In particular, when the contact element 2 is configured such that the other end side (variable portion 2a) is opposed to the positioned electrode with a space therebetween at the first temperature, the electronic device (semiconductor device 90) can be accurately positioned without interference by the contact element 2.

When the temperature control unit 63 (and a thermal module 5) for adjusting the temperature of the contact element 2 and the control unit (inspection control unit 64) for controlling the operation of the measurement unit 61 in association with the operation of the temperature control unit 63 are provided, the measurement can be performed in a condition in which the contact with the contact element 2 is excellent, so that the inspection can be performed more efficiently and accurately.

When the holding mechanism (inspection table 3) is provided with the support face (mounting face 3ft1) for supporting the face (electrode arrangement face 90fe) on which the electrode of the electronic device (semiconductor device 90) is arranged, and the trench 3g that is formed downward from the support face (mounting face 3ft1) and in which one end side (base portion 2b) of the contact element 2 is fixed on the bottom face 3ft2, the electronic device is not deformed by touching the contact element 2 when the electronic device (semiconductor device 90) is mounted. Further, the trench 3g serves as the guide, so that the deformation of the contact element 2 can be made smooth.

When the holding mechanism (inspection table 3) is formed such that the frame portion 31c surrounding the electronic device (semiconductor device 90) is provided in the direction parallel to the face (electrode arrangement face 90fe) on which the electrode of the electronic device (semiconductor device 90) is arranged, the electronic device (semiconductor device 90) can be easily positioned and positional deviation can be prevented.

In the holding mechanism (inspection table 3), the plurality of contact elements 2 are adjacent to each other in the longitudinal direction, and the partition 3s is provided to partition the adjacent contact elements 2, so that a short circuit between the contact elements 2 can be prevented.

When a restraining mechanism (movement prevention tool 4) is provided for restraining the movement of the electronic device (semiconductor device 90) in the direction away from the contact element 2, an excellent contact condition between the electronic device (semiconductor device 90) and the contact element 2 with the pressing force from the contact element 2 can be maintained.

DESCRIPTION OF REFERENCE NUMERALS AND SIGNS

1: mechanism unit, 10: electronic device inspection apparatus, 2: contact element, 2a: variable portion, 3: inspection table (holding mechanism), 31: socket, 31c: frame portion, 3ft: top face, 3ft1: mounting face (support face), 3ft2: bottom face, 3g: trench, 3s: partition, 4: movement prevention tool (restraining mechanism), 5: thermal module (temperature control unit), 6: control unit, 61: measurement unit, 62: holding mechanism control unit, 63: temperature control unit, 64: inspection control unit, 65: inspection result management unit, 90: semiconductor device (electronic device), 90fe: electrode arrangement face, Rc: contact region

The invention claimed is:

1. An electronic device inspection apparatus comprising:
an inspection table to position and hold an electrode disposed in an electronic device;
at least one contact element formed of a shape memory alloy in a long and thin plate shape, one end side of the contact element being fixed to the holding mechanism, the other end side thereof being formed in a shape of a spiral at a first temperature and being developed from the spiral at a second temperature; and
a measurement circuitry to measure the electronic device by conducting a current into the electrode via the contact element, wherein
an axis of the spiral in the other end side is parallel to a face of the positioned electrode, and a contact region is formed along a longitudinal direction between the other end side and the positioned electrode at the second temperature.

2. The electronic device inspection apparatus according to claim 1, wherein, at the first temperature, the other end side of the contact element is opposed to the positioned electrode with a space therebetween.

3. The electronic device inspection apparatus according to claim 1, further comprising:
a temperature controller to adjust a temperature of the contact element; and
a controller to control an operation of the measurement unit in association with an operation of the temperature control unit.

4. The electronic device inspection apparatus according to claim 2, further comprising:
a temperature controller to adjust a temperature of the contact element; and a controller to control an operation of the measurement unit in association with an operation of the temperature control unit.

5. The electronic device inspection apparatus according to claim 1, wherein the inspection table is provided with a support face to support a face of the electronic device on which the electrode is disposed, and a trench that is formed downward from the support face and in which one end side of the contact element is fixed on a bottom face.

6. The electronic device inspection apparatus according to claim 2, wherein the inspection table is provided with a support face to support a face of the electronic device on which the electrode is disposed, and a trench that is formed downward from the support face and in which one end side of the contact element is fixed on a bottom face.

7. The electronic device inspection apparatus according to claim 3, wherein the inspection table is provided with a support face to support a face of the electronic device on which the electrode is disposed, and a trench that is formed downward from the support face and in which one end side of the contact element is fixed on a bottom face.

8. The electronic device inspection apparatus according to claim 1, wherein the inspection table is provided with a frame portion surrounding the electronic device in a direction parallel to the face of the electronic device on which the electrode is disposed.

9. The electronic device inspection apparatus according to claim 2, wherein the inspection table is provided with a frame portion surrounding the electronic device in a direction parallel to the face of the electronic device on which the electrode is disposed.

10. The electronic device inspection apparatus according to claim 3, wherein the inspection table is provided with a frame portion surrounding the electronic device in a direction parallel to the face of the electronic device on which the electrode is disposed.

11. The electronic device inspection apparatus according to claim 5, wherein the inspection table is provided with a frame portion surrounding the electronic device in a direction parallel to the face of the electronic device on which the electrode is disposed.

12. The electronic device inspection apparatus according to claim 1, wherein a plurality of the contact elements are adjacent to each other along a longitudinal direction in the inspection table and a partition is provided to partition the contact elements adjacent to each other.

13. The electronic device inspection apparatus according to claim 2, wherein a plurality of the contact elements are adjacent to each other along a longitudinal direction in the inspection table and a partition is provided to partition the contact elements adjacent to each other.

14. The electronic device inspection apparatus according to claim 3, wherein a plurality of the contact elements are adjacent to each other along a longitudinal direction in the inspection table and a partition is provided to partition the contact elements adjacent to each other.

15. The electronic device inspection apparatus according to claim 5, wherein a plurality of the contact elements are adjacent to each other along a longitudinal direction in the inspection table and a partition is provided to partition the contact elements adjacent to each other.

16. The electronic device inspection apparatus according to claim 1, further comprising a restrainer to restrain movement of the electronic device in a direction away from the contact element.

17. The electronic device inspection apparatus according to claim 2, further comprising a restrainer to restrain movement of the electronic device in a direction away from the contact element.

18. The electronic device inspection apparatus according to claim 3, further comprising a restrainer to restrain movement of the electronic device in a direction away from the contact element.

19. The electronic device inspection apparatus according to claim 5, further comprising a restrainer to restrain movement of the electronic device in a direction away from the contact element.

20. The electronic device inspection apparatus according to claim 8, further comprising a restrainer to restrain movement of the electronic device in a direction away from the contact element.

* * * * *